United States Patent [19]

Gorin

[11] 4,263,088
[45] Apr. 21, 1981

[54] METHOD FOR PROCESS CONTROL OF A PLASMA REACTION

[75] Inventor: Georges J. Gorin, Emeryville, Calif.

[73] Assignee: Motorola, Inc., Schaumburg, Ill.

[21] Appl. No.: 51,661

[22] Filed: Jun. 25, 1979

[51] Int. Cl.³ .......................................... H01L 21/306
[52] U.S. Cl. .................................. 156/626; 156/643;
156/646; 204/192 E; 356/72
[58] Field of Search ............... 156/626, 627, 643, 646;
204/164, 192 E; 250/531; 356/72

[56] References Cited

U.S. PATENT DOCUMENTS

| | | | |
|---|---|---|---|
| 4,085,022 | 4/1978 | Wechsung et al. | 204/192 E |
| 4,092,588 | 5/1978 | Desormiere et al. | 204/192 E |
| 4,115,184 | 9/1978 | Roulsen | 156/626 |
| 4,198,261 | 4/1980 | Busta et al. | 204/192 E |
| 4,208,240 | 6/1980 | Latos | 156/643 |
| 4,209,357 | 1/1980 | Gorin | 204/192 E |

OTHER PUBLICATIONS

Desiletes, "Multiple—Detector" IBM Technical Disclosure Bulletin, vol. 21, No. 3 (8/78) pp. 1035-1037.
Hirobe et al., "End Point—Spectroscopy" J. of Electro Chemical Society (1/80) p. 234.
Ukai et al., "End-Point—Monitoring" J. of Vacuum Science Technology, vol. 16, No. 2, (4/79) pp. 385-387.
Lanzaro, "Individual Wafer Etch.—Reactor" IBM Tech. Disclosure Bulletin, vol. 22, No. 3 (8/79) pp. 1008-1009.
Alcorn, "Determining—Holes" IBM Technical Disclosure Bulletin, vol. 19, No. 3, (8/76) pp. 982-983.

Primary Examiner—Jerome W. Massie
Attorney, Agent, or Firm—John A. Fisher

[57] ABSTRACT

An apparatus and method for controlling a plasma etching reaction. The plasma reaction is controlled by monitoring the output voltage of an optical detector which is responsive to emissions emanating from the reaction. As the output of the detector changes indicating that the first portion of the etching process has been completed, the average power density supplied to the reaction is reduced by switching the applied power from a continuous wave to a pulsed mode. The reaction is allowed to continue the completion in the reduced power mode.

8 Claims, 5 Drawing Figures

METHOD FOR PROCESS CONTROL OF A PLASMA REACTION

BACKGROUND OF THE INVENTION

This invention relates to a process for controlling a reaction, and more particularly to a process for controlling a plasma etching reaction.

Plasma processing is becoming an increasingly important part of manufacturing processes that require etching. This is particularly true in the semiconductor industry where plasma etching is used for removing layers from a semiconductor wafer or for etching patterns in a layer of material overlying a semiconductor wafer. Plasma processing is used to etch precise patterns in layers of polycrystalline silicon, silicon nitride, silicon dioxide, and the like, using a patterned photoresist layer as an etch mask. Plasma processing is also used for stripping photoresist layers, descumming wafers, or other cleaning steps.

It is desirable to have a highly controlled plasma etch process, and more particularly an automatically controlled process. Various control techniques have been proposed and utilized in the past. These techniques include, for example, merely setting the time for the total reaction; detecting the completion of the reaction using a photodetector; and detecting the onset of etching and then allowing the reaction to continue for a set length of time. While these techniques provide a degree of control, they are inadequate for precise process control and for the detection of the end point of the process. All of the above-mentioned techniques can result in an intolerable amount of overetching and the consequent undercutting of the etched layer. Techniques which detect the end of the etching process, for example, do not account for the fact that the etching may proceed non-uniformly across the workpiece. Those areas of the workpiece at which the reaction proceeds most rapidly are likely to be badly undercut before the detector senses the end of the reaction in those areas where the reaction proceeds more slowly. Accordingly, those techniques used in the past have been inadequate to provide the amount of process control and end-point detection necessary in many etching applications.

It is an object of this invention to provide a process for controlling a reaction.

It is a further object of this invention to provide a method for improving uniformity and for decreasing undercutting in a plasma etching process.

It is another object of the invention to provide an improved process for end-point detection in a plasma etching reaction.

It is still a further object of this invention to provide an apparatus for controlling the plasma reaction.

It is still another object of this invention to provide a process which provides improved etch discrimination between dissimilar layers.

SUMMARY OF THE INVENTION

The attainment of these and related objects and advantages may be achieved through the use of the novel reaction control process and apparatus herein disclosed. In one embodiment of the invention the reaction is controlled by monitoring a parameter which changes in relation to the progress of the reaction. Upon detecting a predetermined change in that parameter, the average power density supplied to the reaction is reduced switching the applied power from a continuous wave to a pulsed mode.

The particular details of the invention and the benefits to be derived therefrom will be more readily apparent after review of the following more detailed description of the invention taken in connection with the drawings.

DETAILED DESCRIPTION OF THE PREFERRED EMBODIMENTS

Figure 1:
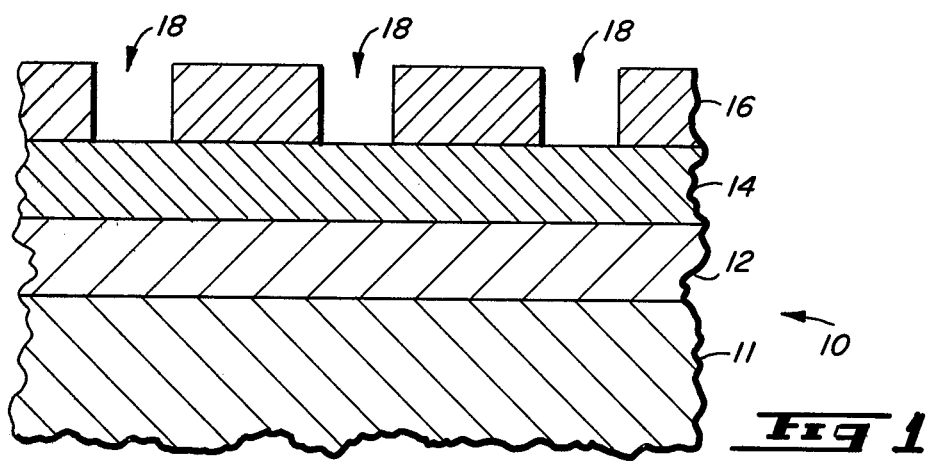
FIG. 1 shows in cross-section a portion of a semiconductor wafer structure to be etched.

As an illustration of one application of the invention, FIG. 1 shows in cross-section a portion of a semiconductor wafer 10. Overlying a semiconductor substrate 11 is a layer of silicon dioxide 12 and a layer of polycrystalline silicon 14. In processing the semiconductor wafer to fabricate transistors, integrated circuits or the like, it is necessary to pattern the polycrystalline silicon layer. This is done by applying a photoresist mask 16 overlying the polycrystalline silicon. Photoresist mask 16 is photolithographically patterned in a pattern that it is desired to replicate in the underlying polycrystalline silicon. The photoresist is an etch mask and prevents etching except in those regions 18 exposed through apertures in the photoresist.

Figure 2:
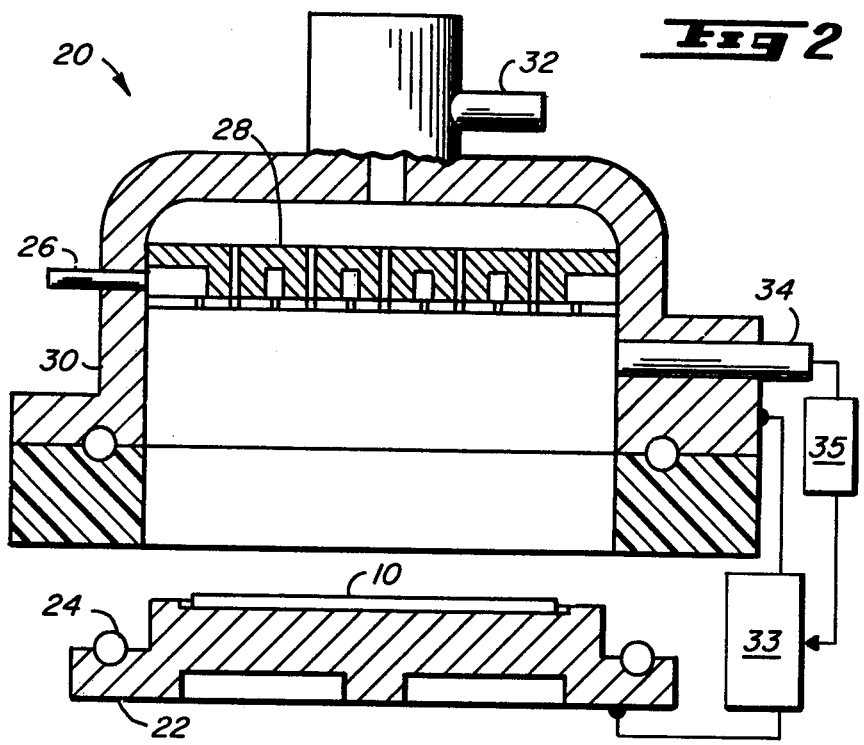
FIG. 2 shows in cross-section a plasma reactor apparatus for practice of the invention.

In accordance with the invention, polycrystalline silicon layer 14 can be etched in a plasma reactor apparatus 20 as shown in FIG. 2. Reactor apparatus 20, described more fully in co-pending application (SC-79732), assigned to the assignee of the present application, is particularly suited to the practice of the invention, but the invention can likewise be carried out in other of various types of plasma reactors. Wafer 10 is placed on wafer holder and bottom electrode 22. The bottom electrode is then raised to a contact position with insulator 24 to close the reactor and enclose wafer 10 within a reaction volume. Reactant gases enter the reactor through inlet 26 and are uniformly distributed throughout the reaction volume by the manifold 28 which is integral with the top electrode 30. A reduced pressure is maintained within the reaction volume by a vacuum pump (not shown) which exhausts gases through outlet 32. A radio frequency (RF) generator 33 (shown schematically) including a matching network and a generator controller 35 are connected to the electrodes 22, 30 and establish an RF field within the reaction volume. This RF field creates a plasma of the reactant gas within the reaction volume. For the etching of polycrystalline silicon the reactant gases can be, for example, a mixture of nitrogen, oxygen and carbon tetrafluoride. The plasma created of these gases chemically etches the exposed polycrystalline silicon. The progress of the etching reaction is monitored by a detector 34. Detector 34 can be an optical detector such as a fairly broadband photocell detector or photomultiplier tube with an optical filter. The detector could also be a mass spectrometer or the like. Particularly useful in this application is a cadmium sulfide photoconductive cell with a maximum spectral sensitivity at about 520 nanometers. The photocell, when coupled with an amplifier, provides a voltage output which is proportional to the intensity of the optical emission of the plasma. This optical emission is enhanced during etching and thus is proportional to the removal rate.

Figure 3:
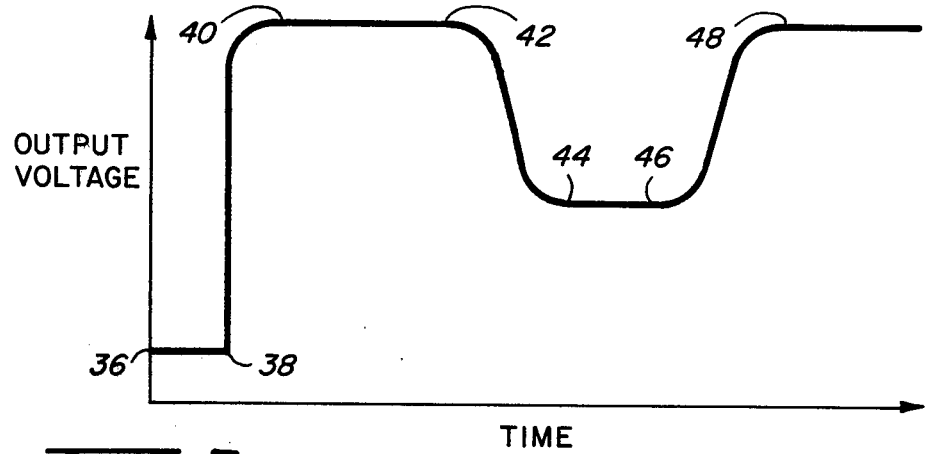
FIG. 3 is a graph of the output of a photodetector during a plasma etch process.

FIG. 3 shows a typical output of the photodetector as a function of time during the plasma etching of wafer 10. Before the etching begins the output voltage is at some low background level 36. When the plasma ignites at time 38, the output level climbs rapidly as the polycrystalline silicon begins to etch. The output levels off at a plateau value 40 as the etching proceeds. The curve begins to dip at 42 when the polycrystalline silicon begins to clear on some portions of the wafer, usually around the edges. As more and more of the polycrystalline silicon etches, the output voltage drops until at about 44 all of the polycrystalline silicon has been removed. The output is again constant at this level as the silicon dioxide beneath the etched polycrystalline silicon also begins to etch. If the process is allowed to continue, the optical emission and thus the output voltage again increase at 46 as the oxide etches through and begins to expose the underlying silicon wafer. The curve again climbs to a plateau value 48 as the silicon wafer etches.

Attempts have been made in the past to use the curve of FIG. 3 for end-point detection and for an automatic means for determining when to terminate the reaction. Difficulties have resulted from such techniques because, although the curve as shown is typical, it is not precisely reproducible from run to run. Further, while the point 44 may represent the time during the process at which all the polycrystalline silicon has been removed, to terminate the process at this time would result in an undesirable amount of undercutting in those portions of the wafer at which the etching had occurred most rapidly and where, therefore, the polycrystalline silicon had cleared first. Terminating the reaction at some time between the points 42 and 44 would give scattered results since the slope of the line from 42 to 44 is likely to change from run to run. Similarly, in many precise etching applications it is not sufficient that the process merely be allowed to run for a certain length of time after the initial drop off in the curve at 42.

While such approaches are appropriate in some applications, the variability in time required to complete the etching leads to a lack of reproducibility, undesirable undercutting and possibly incomplete etching in some runs. FIG. 3 also illustrates the fact that the same reactants will etch more than one material, in this case silicon and silicon dioxide. It is thus desirable to optimize process conditions to maximize the etch discrimination between layers. So doing enhances the "etch-stop" characteristics of a dissimilar underlying layer and minimizes etch damage to that layer.

Figure 4:
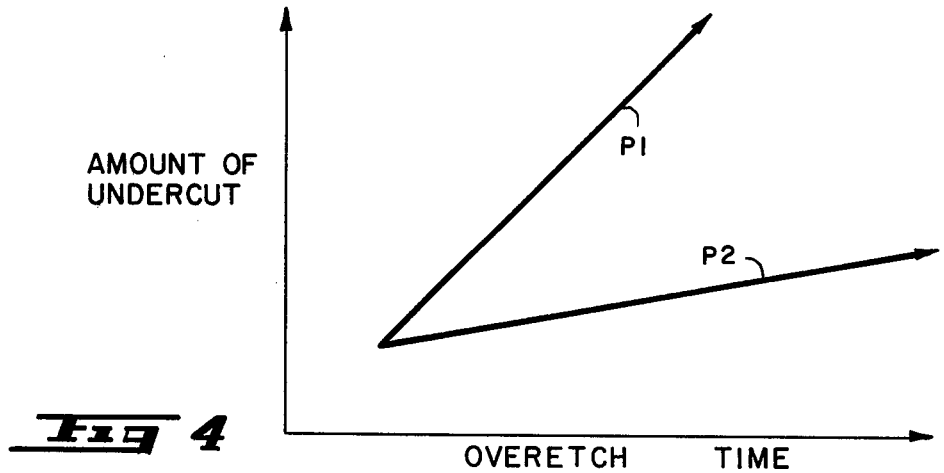
FIG. 4 is a graph of undercutting as a function of overetch time.

It has been found that a significantly greater amount of undercutting occurs at higher power levels. FIG. 4 represents the amount of undercutting that results as a function of overetch time for two different power levels P1 and P2. P1 represents an average applied power about 7.5 times greater than the power of P2. Undercutting is the amount of etching that takes place under the etch mask. Expressed in another way, undercutting is a measure of the amount by which the width of the etched opening exceeds the width of the aperture in the etch mask.

Some non-uniformity in etch rate will exist across the wafer. It is typical, for example, that etching proceeds approximately radially inward. A wafer etched at the higher power level P1 may therefore sustain severe undercutting especially around the edges of the wafer. This results because the etching is continued until all portions of the wafer have been etched. As the center of the wafer is being etched the already cleared portions around the edge of the wafer are being undercut. A wafer etched at a lower power level P2 will evidence less undercutting because of the much reduced slope of the curve of undercutting as a function of overetch time. The total etch time for the second wafer, however, is likely to be intolerably long since the etch rate is a strong function of the average applied power. At the low power level P2 the etch rate is slow and a long etching time is required to clear even the first portions of the wafer.

In accordance with the invention, a process is provided whereby the bulk of the initial etching is done rapidly at a high power level, and the final etching is done controllably and with a minimum of undercutting at a reduced power level. The reduced power level is achieved by modulating the applied RF signal, preferably by switching the RF generator from a continuous to a pulsed mode. The average power is reduced by switching to a pulse mode, not by reducing the peak level. The pulse mode provides etching which is much more reproducible. Reducing the peak power level changes the RF tuning and may require re-tuning the circuit. Reducing the peak power level can also lead to lack of reproducibility since the ionization of the reactant gas is a function of the peak power and the ionization will change as the peak power level is reduced. This problem is especially troublesome with mixtures of gases.

In the following example of preferred embodiment the numbers given are representative only and should not be considered as limiting. The workpiece to be acted upon is a silicon wafer about 75 mm in diameter similar to wafer 10 shown in FIG. 1. Overlying the top surface of the silicon substrate is a layer of silicon dioxide covered by a layer of polycrystalline silicon about 500 nanometers in thickness. To etch a pattern in this polycrystalline silicon layer, a layer of photoresist is applied to the polycrystalline silicon and photolithographically patterned. The wafer is placed in a plasma reactor chamber such as that shown in FIG. 2. The chamber is evacuated to a pressure of about 0.2 Torr, the wafer is heated to about 75° C., and a reactant gas comprising a mixture of oxygen, carbon tetrafluoride, and nitrogen is introduced into the chamber.

Figure 5:
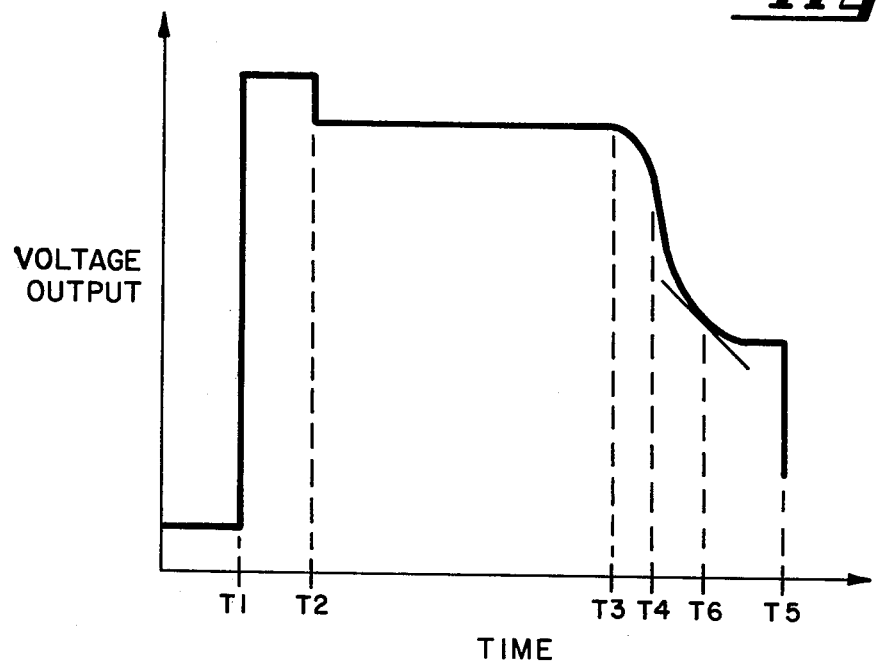
FIG. 5 is a graph of the output of a photodetector during an etch controlled in accordance with the invention.

FIG. 5 shows the output of photocell detector 34 as the reaction is monitored. The output of the detector is electronically coupled to generator controller 35. At time T1 RF energy is applied to the chamber, an RF field is established in the reaction volume, and the volume is filled with plasma reactant species generated by the RF field. About 75 watts of continuous RF power is applied. The generation of the plasma at the beginning of the etching process causes the voltage output of the photocell detector to rise rapidly. During the time interval T1–T2 the gain of the photocell amplifier is automatically adjusted to the amount of light emission from the reaction in order to normalize the etching curve at an arbitrarily selected output voltage value of 0.9 volts.

This normalized value is selected for compatibility with the particular photodetector that is used and serves to establish a uniform level as a starting point.

In the time interval T2–T3, maximum etching of the exposed polycrystalline silicon proceeds and the output of the detector stays approximately constant at the selected value of 0.9 volts. At time T3 the voltage starts decreasing, indicating that the polycrystalline silicon has begun to clear at the edges of the wafer. When the voltage output from the detector drops by 0.1 volt at time T4, the contoller 35 automatically switches generator 33 from a continuous mode to a pulse mode. A low duty cycle is selected so that the average power supplied to the reaction volume is reduced by a factor of about 7 to 8. This changes the etch rate from the P1 curve to the P2 curve in FIG. 4. The trigger point T4 at which the power supply is switched from continuous to pulse mode is arbitrarily selected and can be any voltage level below the previously selected normalized output value. Likewise, the duty cycle of the pulsed energy is variable to provide an arbitrarily selected average power for the reaction. The etching of the polycrystalline silicon is allowed to continue at the reduced power level until the pattern has been completely etched across the wafer. At the termination of the reaction at time T5, the wafer has been etched uniformly with only an acceptable amount of undercutting at all portions of the wafer surface.

The above-described termination of the etching can be caused to occur automatically by the occurrence of one of several events. These events include, for example, the lapse of a specified amount of time after the generator is switched to the pulse mode, or the decrease in the output of the detector to some predetermined level which is representative of the completion of the etching process, equivalent to detecting the level 44 in FIG. 3, or the detection of a particular slope in the output response of the detector. The slope of the output is compared to a preselected slope such as the slope indicated at time T6. Upon the occurrence of any of these events the controller shuts off the generator and terminates the reaction. Alternatively, the process can be controlled by switching to the pulse mode when a preselected slope is detected. The process can then be terminated a preselected time after the power supply is switched.

The interface between the detector and the controller comprises conventional electronics, known per se in the art. The switching from continuous to pulsed mode, for example, can be made to occur at the desired time by using a comparator circuit and comparing the output of the detector to a pre-established reference voltage. Likewise, the generator is switched from continuous mode to a pulse mode having a desired duty cycle by using conventional circuit techniques. Conventional electronics are also used to make a slope comparison.

A wafer etched in accordance with the invention is superior in two respects when compared to a wafer continuously etched at a high power. A wafer processed in accordance with the present invention has much less undercutting, especially around the edges, than the other wafer. Also, the underlying oxide has been etched significantly less. The selectivity ratio, that is, the ratio of the etch rate of polycrystalline silicon to the etch rate of silicon dioxide is found to be 12:1 for a wafer processed in accordance with the invention and only 6.6:1 for a wafer processed in the conventional manner.

Thus it is apparent that there has been provided in accordance with the invention a process and apparatus for controlling an etching reaction which fully meets the objects and advantages set forth above. The invention has been described in conjunction with specific preferred embodiments, but it is evident that many alternatives, modifications and variations will be apparent to those skilled in the art in light of the foregoing description. The process has been illustrated, for example, by the controlled etching of a patterned polycrystalline silicon layer on a semiconductor wafer. The process and apparatus are equally applicable to the etching of other layers commonly found in the semiconductor industry as well as to the etching of other types of workpieces requiring precision etching in the fabrication sequence. The etching of materials other than polycrystalline silicon will, of course, require different reactants, pressures, power levels and the like. Further, the modulation chosen for the applied RF power need not be square wave, so long as the peak power remains approximately the same and the average power decreases. Accordingly, it is intended that the invention embrace all such alternatives, modifications and variations as fall within the spirit and scope of the following claims.

I claim:

1. A process for controlling a plasma reaction in which RF power is supplied to said reaction, said process comprising the steps of: monitoring a parameter which changes in relation to the progress of said reaction; and reducing the average power supplied to said reaction in response to a predetermined change in said parameter by switching said RF power from continuous wave to pulsed.

2. The process of claim 1 wherein the peak power is kept approximately constant.

3. The process of claim 1 wherein said parameter is the voltage output of an optical detector.

4. The process of claim 3 wherein said optical detector is a photoconductive cell.

5. The process of claim 3 wherein said step of reducing the average power is in response to a predetermined decrease in the voltage output of said optical detector.

6. The process of claim 3 wherein said step of reducing the average power is in response to a predetermined slope in the response of the optical detector.

7. A process for controlling a plasma reaction in which RF power is supplied to said reaction, said process comprising the steps of: monitoring a parameter which changes in relation to the progress of said reaction; reducing the average power supplied to said reaction in response to a predetermined change in said parameters; continuing said reaction for a predetermined time after reducing the average power; and terminating said reaction after said predetermined time.

8. A process for controlling the etching reaction of a first layer of material overlying a second layer having an etch rate substantially different from said first layer by selectively controlling the power supplied to said reaction, the process comprising the steps of: monitoring the optical emission emanating from said etching reaction, said emission responsive to the etching of said first layer; detecting a change in said emission, said change indicative that said first layer has been etched through at a first location to expose a portion of said second layer; reducing the average level of said power supplied to said reaction responsive to said change; and completing said reaction at said reduced average level of power.

* * * * *